(12) United States Patent
Totolos, Jr. et al.

(10) Patent No.: US 9,543,988 B2
(45) Date of Patent: Jan. 10, 2017

(54) ADAPTIVELY STRENGTHENING ECC FOR SOLID STATE CACHE

(71) Applicant: NetApp, Inc., Sunnyvale, CA (US)

(72) Inventors: George Totolos, Jr., Cranberry Township, PA (US); Joshua Oren Silberman, Redwood City, CA (US)

(73) Assignee: NetApp, Inc., Sunnyvale, CA (US)

( * ) Notice: Subject to any disclaimer, the term of this patent is extended or adjusted under 35 U.S.C. 154(b) by 246 days.

(21) Appl. No.: 14/289,823

(22) Filed: May 29, 2014

(65) Prior Publication Data

US 2015/0349806 A1 Dec. 3, 2015

(51) Int. Cl.
| | |
|---|---|
| G06F 11/00 | (2006.01) |
| H03M 13/35 | (2006.01) |
| G06F 11/07 | (2006.01) |
| G06F 11/10 | (2006.01) |
| G11C 29/52 | (2006.01) |
| G11C 29/02 | (2006.01) |
| G11C 29/42 | (2006.01) |
| G11C 29/04 | (2006.01) |

(52) U.S. Cl.
CPC .......... *H03M 13/353* (2013.01); *G06F 11/076* (2013.01); *G06F 11/1068* (2013.01); *G11C 29/028* (2013.01); *G11C 29/42* (2013.01); *G11C 29/52* (2013.01); *G11C 2029/0411* (2013.01)

(58) Field of Classification Search
CPC ................ G06F 11/1068; G06F 11/076; G11C 2029/4402; G11C 29/52; G11C 2029/0411
USPC .......................................... 714/773
See application file for complete search history.

(56) References Cited

U.S. PATENT DOCUMENTS

| | | | |
|---|---|---|---|
| 8,060,688 B2 * | 11/2011 | Mergler .............. | G06F 11/1068 711/103 |
| 8,627,183 B1 * | 1/2014 | Chen ................. | H03M 13/2909 714/758 |
| 2015/0074487 A1 * | 3/2015 | Patapoutian ........ | G06F 11/1012 714/758 |

* cited by examiner

*Primary Examiner* — David Ton
(74) *Attorney, Agent, or Firm* — LeClairRyan, a Professional Corporation

(57) ABSTRACT

In an aspect of the subject matter, a "full" amount of the flash cache (e.g., storage cells) is initially utilized to store data i.e., substantially all of the storage space of the flash cache may be designated to store user data, with the remaining storage space designated to store ECC information (e.g., parity bits) associated with a predefined ECC algorithm utilized to encode the user data. When a bit errors associated with the user data reaches a predefined threshold value, the storage space of the flash cache may transition to store less user data so as to accommodate the space needed to store ECC information associated with a stronger ECC algorithm. The storage space of the flash cache designated to store user data is reduced, while the storage space designated to store ECC information is increased to accommodate the stronger ECC algorithm.

20 Claims, 6 Drawing Sheets

ADAPTIVELY STRENGTHENING ECC FOR SOLID STATE CACHE

BACKGROUND

Technical Field

The subject matter herein relates to flash devices and, more specifically, to a technique for adaptively strengthening error correction code for a flash cache.

Background Information

Due to the low costs associated with Multi-Level Cell (MLC) flash devices, enterprise storage companies are looking for ways to switch their flash solutions over to MLC technology. Unfortunately, typical MLC devices are only guaranteed for 20,000 program/erase cycles and may have up to 36 bit errors across a 1,040-byte sector. This shorter endurance may cause some challenges to the use of this technology in enterprise storage products. Thus, what is needed is a technique to extend or prolong the life of a flash device, specifically a MLC flash device.

BRIEF DESCRIPTION OF THE DRAWINGS

The above and further advantages of the subject matter herein may be better understood by referring to the following description in conjunction with the accompanying drawings in which like reference numerals indicate identically or functionally similar elements, of which.

OVERVIEW

The subject matter herein is directed to a technique for adaptively strengthening error correction code (ECC) for a flash cache (e.g., NAND flash cache) of a storage system as the flash cache ages over time and becomes more unreliable. According to the technique, a "full" amount of the flash cache (e.g., storage cells) is initially utilized to store data i.e., substantially all of the storage space of the flash cache may be designated store user data (e.g., data bits of a "codeword"), with the remaining storage space designated to store ECC information (e.g., parity bits of a "codeword") associated with a predefined ECC algorithm utilized to encode the user data. By using the full amount of the flash cache, more user data can be stored across the storage space of the cache, thereby increasing the storage capacity (and storage service) of the cache, while also leveling flash wear to prolong the life of the flash cache.

In an aspect of the subject matter, a flash module may be configured to monitor bit errors associated with the flash cache as the cache ages over time and becomes more unreliable. When the bit errors reach a predefined threshold value, the storage space of the flash cache may transition to store less user data so as to accommodate the space needed to store additional ECC information associated with a stronger ECC algorithm. For example, when the bit error rate (e.g., certain number of bit errors for a predefined number of bits) monitored by the flash module reaches a predefined threshold value, the storage space of the flash cache designated to store user data is reduced, while the storage space designated to store ECC information is increased to accommodate the stronger ECC algorithm. Further, when the bit error rate of the flash cache reaches one or more next predefined threshold values, the storage space designated to store user data may be further reduced, while the storage space designated to store ECC information is further increased to accommodate a yet stronger ECC algorithm. As such, the storage space designated to store user data gradually decreases over time, while the storage space designated to store ECC information increases over time.

DESCRIPTION

Figure 1:
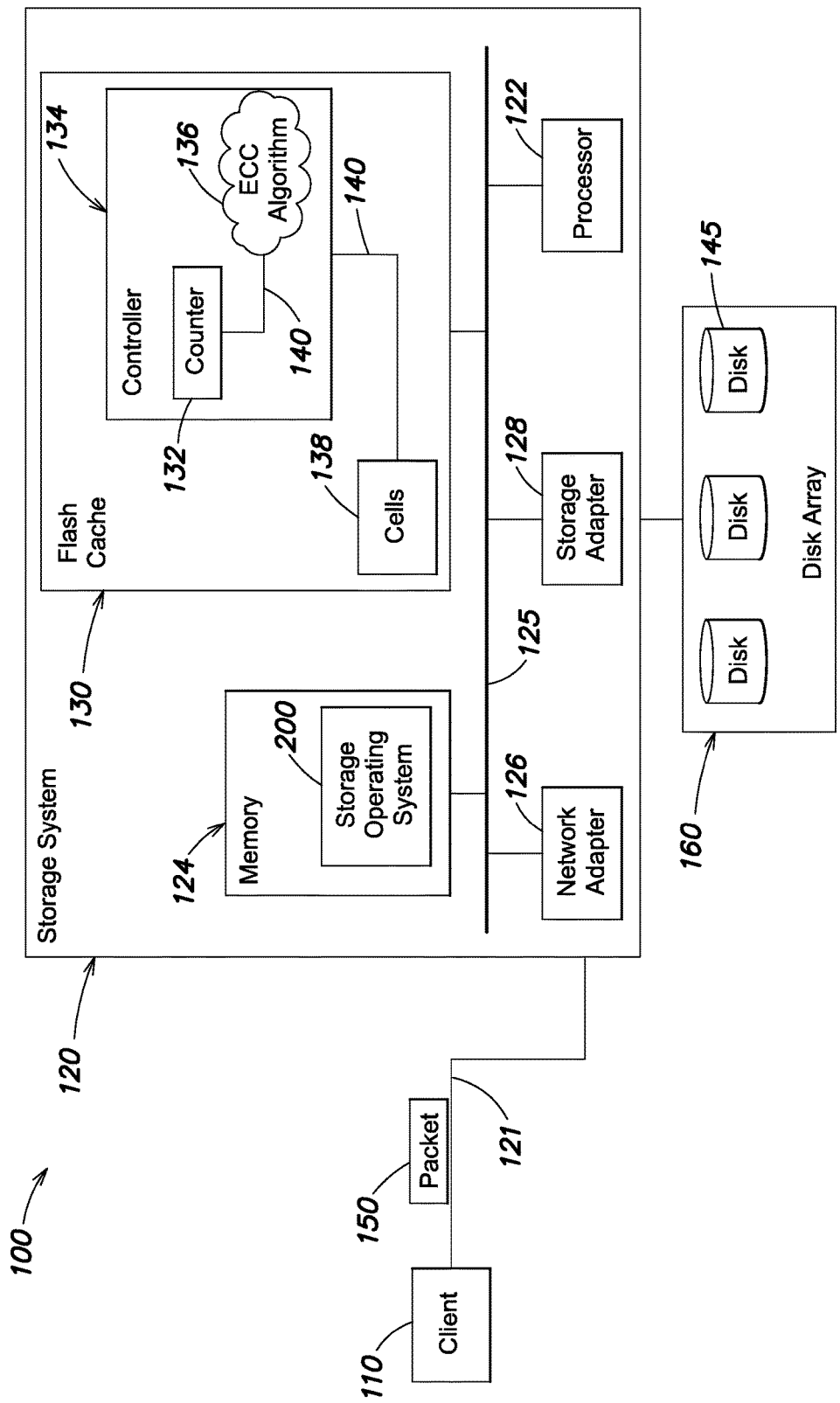
FIG. 1 is a schematic block diagram of storage system environment.

FIG. 1 is a schematic block diagram of a storage system environment 100 that may be advantageously used with the subject matter described herein. The storage system environment 100 includes a storage system 120, coupled to one or more storage devices 145 of an array 160 and interconnected with one or more clients 110 by a network 121. The storage system 120 may be configured to operate as part of a client/server arrangement, as will be understood by those skilled in the art, to provide storage services to the clients 110.

In operation, the storage system 120 services data access requests (e.g., read/write requests) issued by the clients 110 over the network 121. Each client 110 may be a general-purpose computer configured to execute applications and interact with the storage system 120 in accordance with the client/server model of information delivery. That is, the client may request the services of the storage system 120, and the storage system may return the results of the services requested by the client 110, by exchanging packets 150 over the network 121. The clients may issue packets including file-based access protocols, such as the Common Internet File System (CIFS) protocol or Network File System (NFS) protocol, over TCP/IP when accessing information, such as data, in the form of data containers, such as files and directories. Alternatively, the client may issue packets including block-based access protocols, such as the Small Computer Systems Interface (SCSI) protocol encapsulated over TCP (iSCSI) and SCSI encapsulated over Fibre Channel (FCP), when accessing information in the form of data containers, such as blocks or logical unit numbs (luns).

Illustratively, the storage system 120 includes a processor 122, a memory 124, a network adapter 126, a storage adapter 128, and a flash cache 130 interconnected by a system bus 125. The storage system 120 also includes a storage operating system 200 that illustratively implements a high-level module, such as a file system, to logically organize the information as a hierarchical structure of named storage containers, such as directories, files, and special types of files called virtual disks (hereinafter "blocks") on the disks. Illustratively, the storage operating system 200 may be implemented as a set of kernel mode processes.

The memory 124 includes memory locations that are addressable by the processor 122 and adapters for storing software programs and/or processes and data structures associated with the subject matter discussed herein. The processors and adapters may include processing elements and/or logic circuitry configured to execute the software programs/processes and manipulate the data structures, as described below. The storage operating system 200, portions of which are typically resident in memory and executed by the processing elements, functionally organizes the storage system 120 by, inter alia, invoking storage operations executed by the storage system. It will be apparent to those skilled in the art that other processing and memory means, including various computer readable media, may be used for storing and executing program instructions pertaining to the subject matter described herein. It is also expressly contemplated that the various software programs, processes and layers described herein may be embodied as modules configured to operate in accordance with the disclosure, e.g., according to the functionality of a software program, process or layer.

The network adapter 126 comprises the mechanical, electrical and signaling circuitry needed to connect the storage system 120 to the client 110 over computer network 121, which may include one or more point-to-point connections or a shared medium, such as a local area network. Illustratively, the computer network 121 may be embodied as an Ethernet network or a Fibre Channel (FC) network. The client 110 may communicate with the storage system over network 121 by exchanging discrete frames or packets 150 of data according to pre-defined protocols, such as the Transmission Control Protocol/Internet Protocol (TCP/IP).

The storage adapter 128 may cooperate with the storage operating system 200 executing on the storage system 120 to access information requested by the client 110. The information may be stored on any type of attached array of writable storage device media such as video tape, optical, DVD, magnetic tape, bubble memory, electronic random access memory, micro-electro mechanical and any other similar media adapted to store information, including data and parity information. However, the information is preferably stored on disks 145, such as hard disk drives (HDDs) and/or direct access storage devices (DASDs). The storage adapter 128 includes input/output (I/O) interface circuitry that couples to the disks 145 over an I/O interconnect arrangement, such as a conventional high-performance, FC serial link topology.

Storage of information on array 160 may be implemented as one or more storage "volumes" that include a collection of physical storage disks 145. The disks within a volume may be organized as one or more groups, wherein each group may be operated as a Redundant Array of Independent (or Inexpensive) Disks (RAID). Most RAID implementations enhance the reliability/integrity of data storage through the redundant writing of data "stripes" across a given number of physical disks in the RAID group, and the appropriate storing of parity information with respect to the striped data. An illustrative example of a RAID implementation is a RAID-4 level implementation, although it should be understood that other types and levels of RAID implementations may be used in accordance with the subject matter described herein.

In an aspect of the subject matter, the flash cache 130 may be embodied as Multi-Level Cell (MLC) NAND flash cache that includes a controller 134 and a plurality of block-oriented NAND storage cells 138 coupled by an interconnect, such as bus 140. The NAND storage cells 138 may be utilize to store information (e.g., user data and ECC information associated with a codeword). Typically, the NAND storage cells 138 of the flash cache 130 may be organized as a series of blocks which are divided into several pages. Typically, each page includes a main area configured to store user data and a spare area configured to store information associated with error detection and correction, etc. Further, the cells 138 of the flash cache may be organized into a granularity of one or more sectors, where a sector may be a plurality of cells 138 on a same page, a plurality of cells 138 across different pages of the same block, or a plurality of cells 138 across different blocks. Although the flash storage cells are illustratively block-oriented NAND cells, it will be understood to those skilled in the art that other block-oriented, non-volatile, solid-state electronic devices with associated storage cells or components may be advantageously used with the subject matter described herein.

In an aspect of the subject matter, the controller 134 may be configured to control, e.g., read and/or write access to information stored on an array of non-volatile flash storage cells 138. For example, the flash cache 130 may be configured to store a temporary copy of user data, while a permanent copy of the data may be stored on the storage device 145 coupled to the storage system 120. When a data access request (e.g., read request) is made by the client 110, the controller 134, for example, may serve the data from the flash cache 130, if a copy of the data is present/available therein. The controller 134 may be configured to execute one or more ECC algorithms 136 using a counter 132. Each ECC algorithm 136 may be utilized to correct bit errors associated with data stored on cells 138. Specifically, the ECC algorithm 136 may include flash correction schema, such as Forward Error Correction (FEC) codes. Further, such FEC codes may be, but are not limited to, BCH codes and Low Density Parity Check (LDPC) codes, as known by those skilled in the art. For example, prior to storing data on storage cells 138 (received from storage system 120), the ECC algorithm 136 may be utilized to generate redundancy information (e.g., parity and/or checksum bits) for the data. The redundancy information may then be stored with the user data on the storage cells 138, and, for example, on the same page. As such, the redundancy information and the ECC algorithm 136 may be utilized to correct bit errors associated with the user data, as known by those skilled in the art. The corrected data may then be sent to the requesting client 100.

Further, the counter 132 may be utilized to store a value associated with a bit error rate for user data stored on the cells 138. Illustratively, when a client 110 issues a read request for user data stored on a sector of cells 138 (e.g., a plurality of cells on the same page), the redundancy information may be re-calculated and compared to the redundancy information already stored on the sector of cells 138. If the re-calculated redundancy information does not match the redundancy data stored on the cells 138, the controller 134 may determine the number of bits errors encountered for a predetermined number of bits. For example, the controller may determine, based on the comparison, that for every 10 bits of user data there is 1 bit that is in error (e.g., bit error rate). As such, the counter 132 may be set to a value of 1. Alternatively, and based on the comparison, the controller 134 may determine the number of read requests that encountered a bit error during a predetermined number of read requests. For example, the controller 134 may determine that for every 10 read requests, 3 read requests encountered a bit error(s). As such, the counter 132 may be set to a value of 3. As the bit error rate increases over time (and the flash cache 130 ages and becomes more unreliable), the counter 132 may be incremented.

Figure 2:
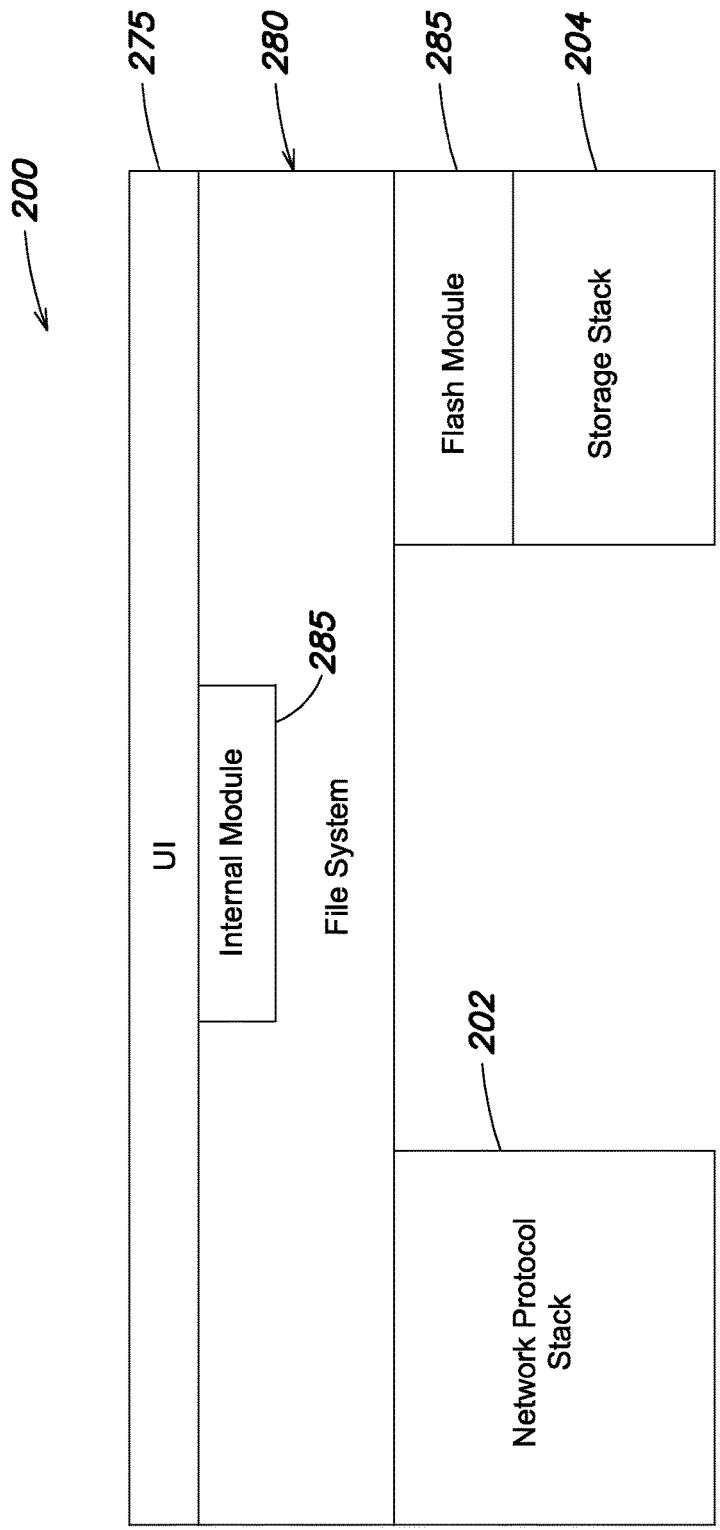
FIG. 2 is a schematic block diagram of a storage operating system.

FIG. 2 is a schematic block diagram of a storage operating system 200 that may be advantageously used with the subject matter described herein. The storage operating system includes a series of software layers organized to form an integrated network protocol stack 202 or, more generally, a multi-protocol engine that provides data paths for clients to access information using block and file access protocols. In addition, the storage operating system includes a storage stack 204 that includes storage modules that implement a storage (e.g., RAID) protocol and manage the storage and retrieval of information to and from the flash cache 130 and array 160 in accordance with I/O operations. Bridging the storage stack 204 with the integrated network protocol stack 202 is a virtualization system that is implemented by a file system 280 that enables access by administrative interfaces, such as a user interface (UI) 275, in response to a user (system administrator) issuing commands to the storage system. The UI 275 is disposed over the storage operating system in a manner that enables administrative or user access to the various layers and systems.

According to the subject matter described herein, storage stack 204 includes a process embodied as a flash module 285 that may, for example, cooperate with the flash cache 130 to perform operations associated with the subject matter described herein. Specifically, the flash module 285 may determine whether the bit error rate associated with the flash cache 130 has reached a predefined threshold value by querying the counter 132 of the flash cache 130. More specifically, the flash module 285 may query the counter 132 and compare the value of the counter 132 with the predefined threshold value to determine whether the bit error rate of the flash cache 130 has reached the predefined threshold value. For example, the counter value may be 2 indicating that for every 10 bits (or another amount of bits), there are 2 bits that are in error (e.g., bit error rate). Alternatively, the counter value of 2 may indicate that for a number of, e.g., 10, read operations (or another amount of read operations), 2 read operations encountered bit errors (e.g., bit error rate). Thereafter, the counter value of 2, indicating the bit error rate, may be compared with the predefined threshold value that, for example, may be set by an administrator. In this example, the predefined threshold value may be 2. Since the predefined threshold value has been reached, the flash module 285 may send one or more instructions to the flash cache 130 instructing controller 134 to alter or change the designation of the cells 138, as described below. If the predefined threshold value had not been reached (e.g., counter value is 1), then the flash cache 130 is not instructed to alter or change the designation of the cells 138, and the flash cache 130 continues to operate.

In an aspect of the subject matter, a technique is provide that adaptively strengthens the ECC algorithm for the flash cache 130 as the flash cache 130 ages over time and becomes more unreliable. According to the technique, a "full" amount of the flash cache 130 (e.g., storage cells) is initially utilized to store data i.e., substantially all of the storage space of the flash cache may be designated to store user data (e.g., data bits of a "codeword"), with the remaining storage space designated to store ECC information (e.g., parity bits of a "codeword") associated with a predefined ECC algorithm utilized to encode the user data. By using the full amount of the flash cache 130, more user data can be stored across the storage space of the cache 130, thereby increasing the storage capacity (and storage service) of the cache 130, while also leveling flash wear to prolong the life of the flash cache 130.

In an aspect of the subject matter, the flash module 285 may be configured to monitor the bit errors associated with the flash cache 130 as the cache ages over time and becomes more unreliable. When the bit errors reach a predefined threshold value, the storage space of the flash cache 130 may transition to store less user data so as to accommodate the space needed to store additional ECC information associated with a stronger ECC algorithm. For example, when the bit error rate (e.g., certain number of bit errors for a predefined number of bits) monitored by the flash module 285 reaches a predefined threshold value, the storage space of the flash cache 130 designated to store user data is reduced, while the storage space designated to store ECC information is increased to accommodate the stronger ECC algorithm. Further, when the bit error rate of the flash cache 130 reaches one or more next predefined threshold values, the storage space designated to store user data may be further reduced, while the storage space designated to store ECC information is further increased to accommodate a yet stronger ECC algorithm. As such, the storage space designated to store user data gradually decreases over time, while the storage space designated to store ECC information increases over time.

Figure 3B:
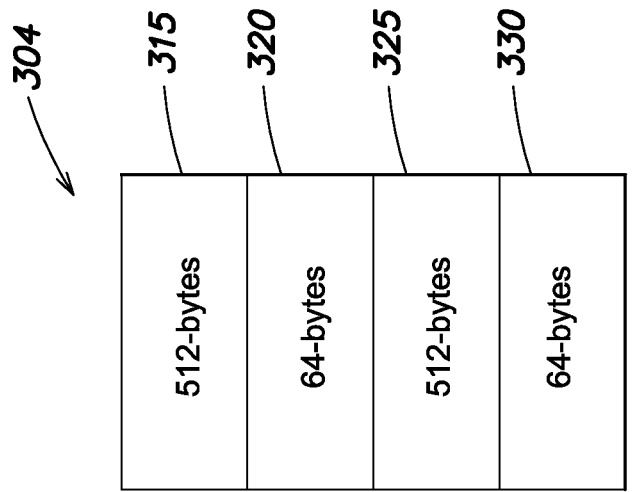
FIGS. 3A and 3B are schematic block diagrams of implementations of a flash cache configured for adaptive Error Correction Code (ECC) strengthening.
Figure 3A:
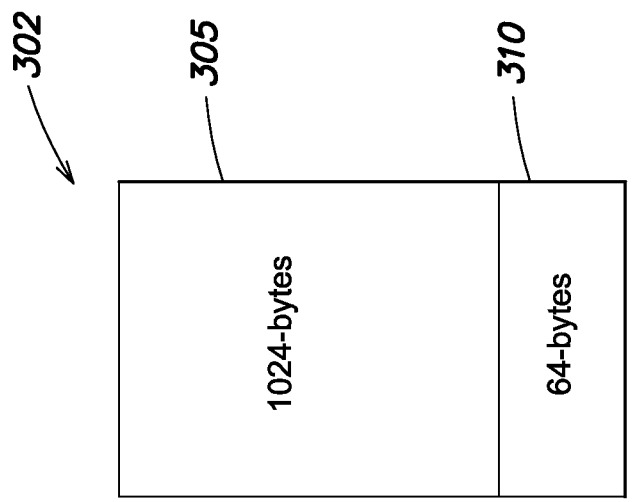

FIGS. 3A and 3B are schematic block diagrams of implementations of the flash cache configured for adaptive ECC strengthening. At initialization, the storage space 302 (e.g., storage cells 138) of a first implementation of the flash cache 130 of FIG. 3A may be apportioned into data section 305 and ECC section 310. For example, storage space 302 may be a page of the flash cache 130. Further, data section 305 may be a sector of the page and may be the "full" amount of storage space, e.g., 1024-bytes, designated to store user data. The user data stored on storage cells 138 in section 305 may be retrieved from storage devices 145 and subsequently provided to the client 110 in response to a read request. Further, ECC section 310 may be a sector of the page, e.g., 64-bytes, designated to store ECC information (e.g., parity bits) associated with the user data stored in data section 305. Illustratively, an ECC algorithm 136 (e.g., BCH or LDPC) configured to support variable size codewords for the flash cache 130 in FIG. 3A, may be employed to correct 36 bits scattered across the 1024-bytes of data section 305. The flash module 285 may monitor the bit errors associated with the user data stored in section 305, as the flash cache 200 ages over time and becomes more unreliable. The counter 132 may be configured to store a value associated with the bit error rate for the data stored in section 305 based on a comparison of the redundancy information stored in section 310 and re-calculated redundancy information. When the flash module 285 determines that the bit error rate of the first flash cache implementation reaches a predefined threshold value, storage space of the flash cache designated to store user data may be transitioned to store redundancy information associated with a stronger ECC algorithm. For example, the flash module 285 may determine, based on the counter 132, that the bit error rate associated with the data stored in section 305 reached a predefined threshold value (preconfigured by an administrator, for example), and may then instruct the controller to alter/change the designation of the storage space, such that storage space that was designated to store user data is lessened, while the storage space designated to store redundancy information associated with a stronger ECC algorithm is increased.

For example, and as depicted in FIG. 3B, when the flash module 285 determines that the bit error rate associated with the data stored in data section 305 of the flash cache 130 reaches a predefined threshold value, the data section 305 of 1024-bytes may be split into two 512-byte data sections 315 and 325, e.g., in accordance with a second implementation of the flash cache 130. Storage space that was designated to store user data may be transitioned and designated to store the "extra" 64-bytes of ECC information to form storage space 304 of the flash cache. That is, the storage space designated to store user data is decreased, while the storage space to store ECC information is increased. Illustratively, the ECC section 320 may be utilized to correct 36 bits across the 512-bytes of data section 315, and the ECC section 330 may be utilized to correct 36 bits across the 512-bytes of data section 325. Therefore, the second flash cache implementation of FIG. 3B, which depicts storage space designated to store user data transitioning to store ECC information, provides stronger error correction than the first flash cache implementation of FIG. 3A. Further, because the ECC algorithm supports variable size codewords, a new algorithm for the flash cache implementation of FIG. 3B is not necessary.

In an aspect of the submect matter, the ECC algorithm 136, utilized by the flash cache implementations of FIGS. 3A and 3B, may be a layered ECC algorithm that includes a flash correction schema (such as BCH or LDPC) with an embedded single error correcting and double error detecting (SEC-DED) code. Specifically, the SEC-DED code corrects 1-bit errors and detects 2-bit errors across a variable size of bits, for example, a 72 bit codeword. Thereafter, the results from this "first" layer of error correction may be sent to the flash correction schema (i.e., "second" layer of error correction). Further, after the "first" layer of error correction is performed on the data, the flash module 285 may monitor the bit error rate associated with the results to determine whether the bit error rate associated with the user data stored on the flash cache 130 reaches the predefined threshold value. Utilization of the "first" layer of error correction advantageously reduces the bit error rate, while the storage space designated to store user data may be transitioned to store ECC information at later point in time.

Figure 4:
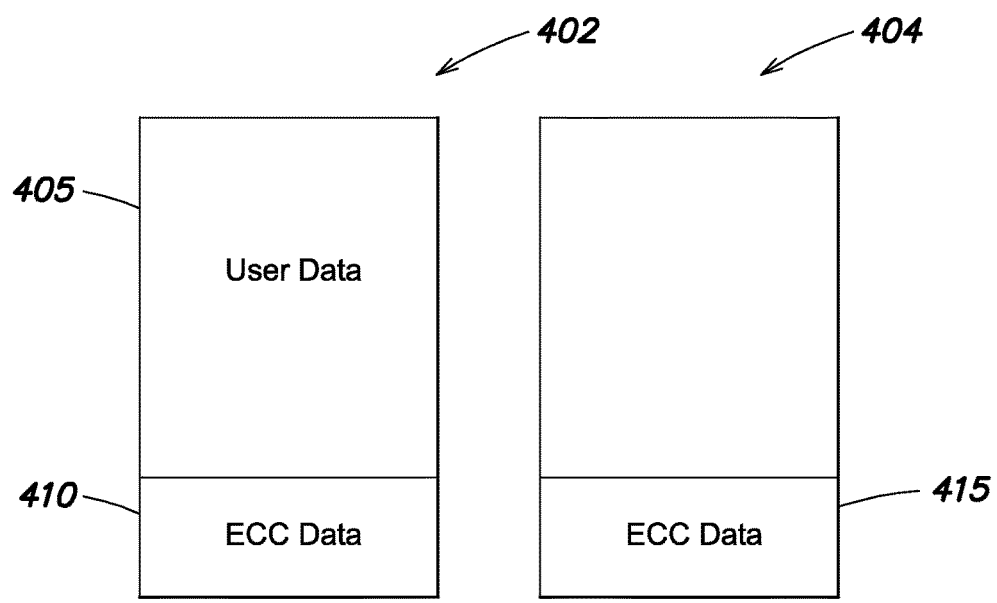
FIG. 4 is schematic block diagrams of an implementation of a flash cache configured for adaptive ECC strengthening.

FIG. 4 is a schematic block diagrams of an implementation of the flash cache configured for adaptive ECC strengthening the ECC for a flash cache 130. As known by those skilled in the art, the page organization within NAND memory creates size constraints between the user data and ECC information. It may be desirable for all information, i.e., the user data and the ECC information, to be present in a single flash page in order to minimize access latency. Further, and as known by those skilled in the art, the error correction schemas that are employed are typically directed to correcting a worst case number of bit errors, which occurs infrequently. Accordingly, a single page 402 of the flash cache 130 may store user data in data section 405 and store ECC information associated with a ECC algorithm in section 410. When the flash module 285 determines that the bit error rate associated with the user data stored in data section 405 reaches the predefined threshold value, a section 415 of a different page 404 of the flash cache 130 may be designated to store EEC information associated with a stronger ECC algorithm, for correcting the worst case scenario of bit errors. Access to this different page may be necessary in the infrequent case in which the ECC information stored in section 410 is not able to correct the user data stored in data section 405. Advantageously, the organization of the page 402 and the layout of the information on the page 402 does not have to be altered to accommodate the ECC information associated with the stronger ECC algorithm.

Figure 5B:
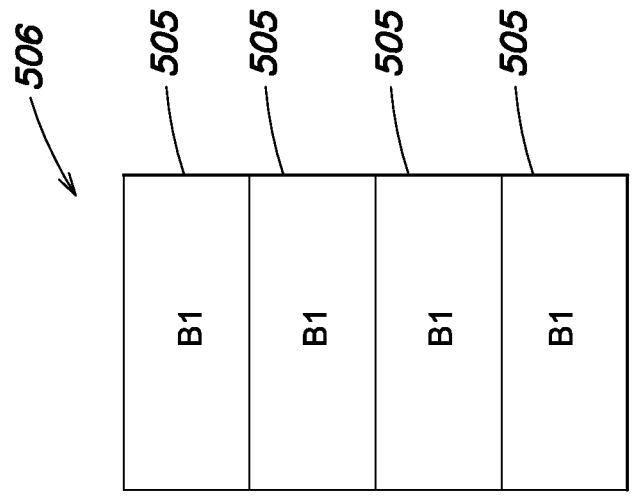
FIGS. 5A and 5B are schematic block diagrams of implementations of a flash cache configured for adaptive ECC strengthening.
Figure 5A:
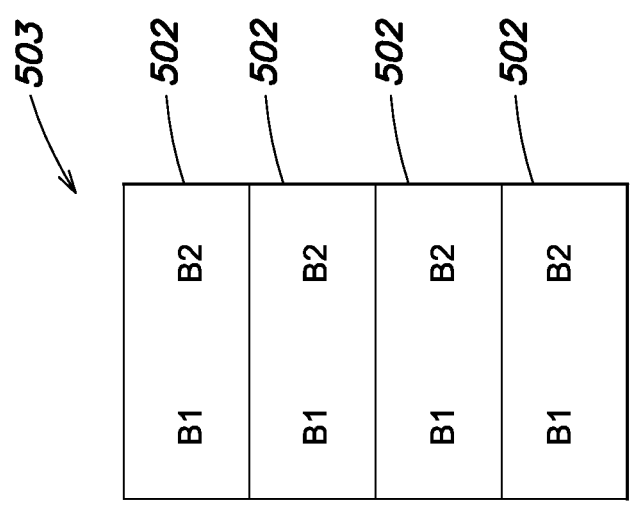

FIGS. 5A and 5B are schematic block diagrams of implementations of the flash cache configured for adaptive ECC strengthening. As known by those skilled in the art, most MLC NAND flash memories have four possible states per cell, such that each cell may store two bits of information. As shown in FIG. 5A, each cell 502 of a page 503 of the flash cache 130 may store 2 bits, e.g., B1 and B2. The flash module 285 may monitor the unreliability (bit error rate) associated with the cells 502 as the flash cache ages over time utilizing the counter 132. Illustratively, the counter 132 may store a value of 2 indicating that for every 10 bits of data in the page 503, 2 bits are in error. When the bit error rate reaches the predefined threshold value, the cells 502 of the page 503 are transitioned to store a single bit. In this example, the predefined threshold value may be 1, and the flash module 285 may compare the counter value of 2 with the predefined threshold value of 1. Thus, the flash module 285 may determine that the bit error rate has reached the predefined threshold value and may cause the controller to alter or change the designations of the cells of the page 503. As shown in FIG. 5B, each cell 505 of the page of 506 of the flash cache 130 may now store 1 bit, e.g., B1, in response to the flash module 285 determining that the bit error rate has reached the predefined threshold value. As such, the MLC NAND flash memory functions as a single level cell (SLC) device when the flash module 285 determines that the bit error rate of the cell reaches the predefined threshold value. Therefore, the cells of page 506 (as depicted in FIG. 5B) function as SLC devices and have an error rate that is less than the cells of page 503 (as depicted FIG. 5A) that function as MLC devices. Thus, although the error rate improves, the storage capacity of the cell decreases.

Figure 6:
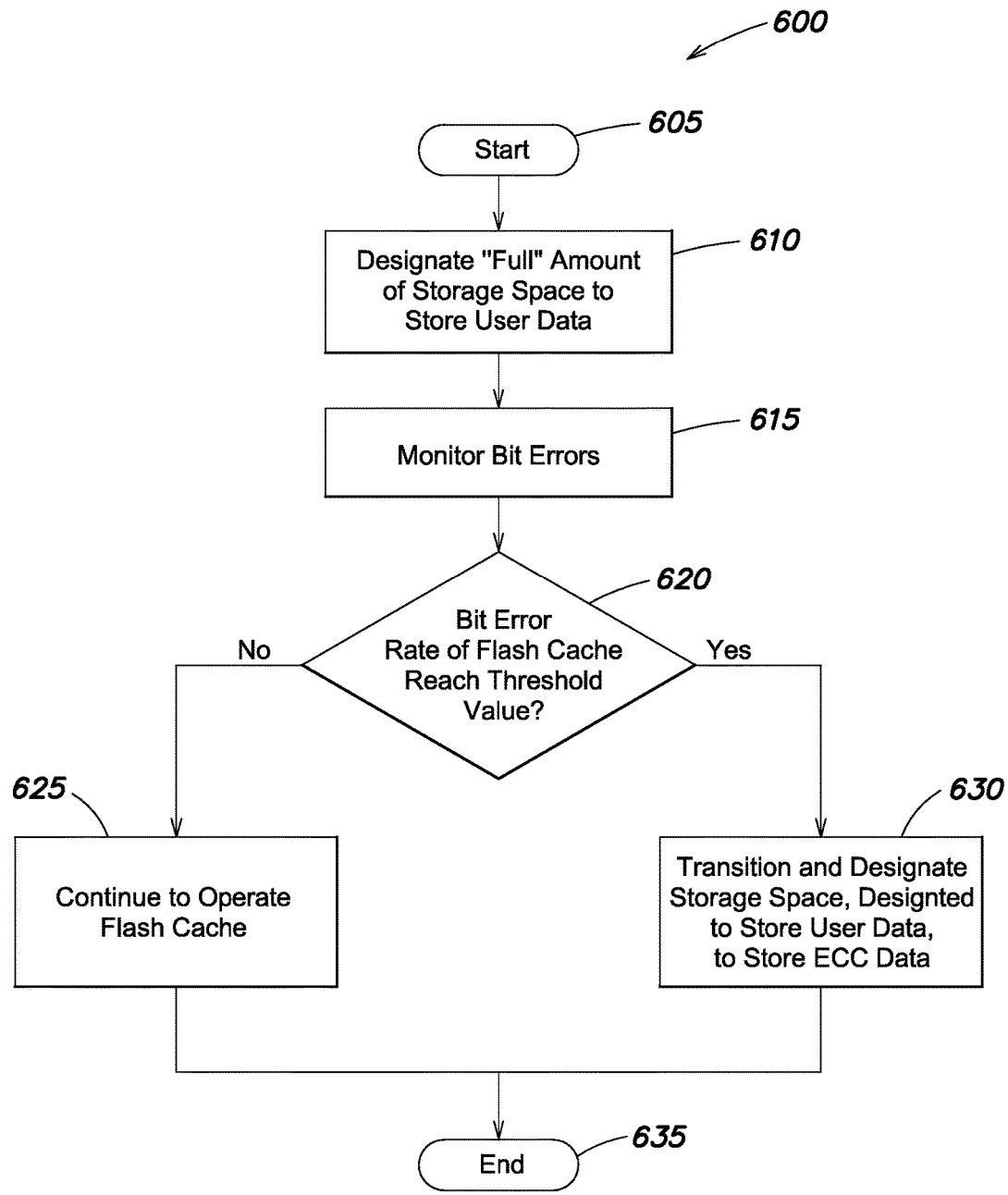
FIG. 6 is a flowchart detailing the steps of a procedure for adaptively strengthening an ECC for the flash cache.

FIG. 6 is a flowchart detailing the steps of a procedure 600 for adaptively strengthening the ECC for a flash cache in accordance with the subject matter described herein. The procedure 600 starts at step 605 and continues to step 610, where a "full" amount of storage space of the flash cache is utilized to store user data. For example, substantially all of the storage space (e.g., storage cells 138) of the flash cache may be designated to store user data, while a small portion of the storage space may be designated to store ECC information for error correction. By using the full amount of the flash cache, more user data can be stored across the storage space of the cache, thereby increasing the storage capacity (and storage service) of the cache, while also leveling flash wear to prolong the life of the flash cache. At step 615, the bit error rate associated with user data stored the flash cache is monitored. For example, the flash module may monitor the bit error rate as the flash cache ages over time and becomes more unreliable.

At step 620, a determination is made as to whether the bit error rate of the flash cache reaches a predefined threshold value. Illustratively, the value of the counter 132 may be compared with a predefined threshold value. If at step 620, it is determined that the bit error rate of the flash cache has not reached the predefined threshold value, the procedure branches to step 625 and the flash cache continues to operate with the same amount of storage space designated to store user data and the same amount of storage space designated to store ECC information. If at step 620, it is determined that the bit error rate of the flash cache has reached the predefined threshold value, the procedure branches to step 630 and storage space designated to store user data is transitioned to store ECC information associated with a stronger ECC algorithm. Further, if the bit error rate of the flash cache reaches a second predefined threshold value, additional storage space designated to store user data may be transitioned and designated to store ECC information associated with a yet stronger ECC algorithm. At step 635, the procedure ends.

The foregoing description has been directed to specific subject matter. It will be apparent, however, that other variations and modifications may be made to the described subject matter, with the attainment of some or all of its advantages. It is expressly contemplated that the procedures, processes, and methods described herein may be implemented in alternative orders. For example, although reference is made transitioning storage space of a page of the flash cache, different granularities may be utilized. Specifically, the subject matter described herein may be applied to sectors of a page, multiple pages, or a block of the flash cache. Accordingly this description is to be taken only by way of example and not to otherwise limit the scope of the subject matter described herein. Therefore, it is the object of the appended claims to cover all such variations and modifications as come within the true spirit and scope of the subject matter.

What is claimed is:

1. A system comprising:
a processor configured to execute one or more processes; and
a memory configured to store a process executable by the processor, the process when executed operable to:
apportion a flash device having storage space into two sections, a first section of the storage space configured to store user data and a second section of the storage space configured to store redundancy information for the user data; and
determine a bit error rate associated with user data stored on the flash device, and the process further executable to increase the storage space of the second section configured to store the redundancy information and decrease the storage space of the first section configured to store the user data, in response to determining that the bit error rate associated with the user data has reached a predefined threshold.

2. The system of claim 1, wherein the process when executed is further operable to increase the second section by a first amount and decrease the first section by the first amount.

3. The system of claim 1 wherein the redundancy information, stored in the second section prior to increasing the storage space of the second section, is associated with a first error correction code algorithm.

4. The system of claim 3 wherein the redundancy information, stored in the second section after increasing the storage space of the second section, is associated with a second error correction code algorithm that is stronger than the first error correction algorithm.

5. The system of claim 1, wherein the process when executed is further operable to increase the storage space of the second section by a further amount and decrease the storage space of the second section by the further amount, in response to the bit error rate associated with the user data having increased and reached a different predefined threshold.

6. The system of claim 1, wherein the flash device is a multi-level cell (MLC) NAND flash cache.

7. The system of claim 6, wherein the first section and second section together define a page of the MLC NAND flash cache.

8. The system of claim 1, wherein the process when executed is further operable to allocate a third section of storage space of the flash device to store the redundancy data, in response to the bit error rate associated with the user data having increased and reached a different predefined threshold, wherein the first section and the second section together define a first page of the flash device and the third section is part of a different page of the flash device.

9. A method comprising:
determining, by a processor, a bit error rate associated with user data stored on a flash device having storage space apportioned into two sections, a first section of the storage space configured to store the user data and a second section of the storage space configured to store redundancy information for the user data; and
in response to determining that the bit error rate associated with the user data has reached a predefined threshold, increasing the storage space of the second section configured to store the redundancy information and decreasing the storage space of the first section configured to store the user data.

10. The method of claim 9, further comprising increasing the second section by a first amount and decreasing the first section by the first amount.

11. The method of claim 9 wherein the redundancy information, stored in the second section prior to increasing the storage space of the second section, is associated with a first error correction code algorithm.

12. The method of claim 11 wherein the redundancy information, stored in the second section after increasing the storage space of the second section, is associated with a second error correction code algorithm that is stronger than the first error correction algorithm.

13. The method of claim 9, further comprising in response to the bit error rate associated with the user data having increased and reached a different predefined threshold, increasing the storage space of the second section by a further amount and decreasing the storage space of the second section by the further amount.

14. The method of claim 9, wherein the flash device is a multi-level cell (MLC) NAND flash cache.

15. The method of claim 14, wherein the first section and second section together define a page of the MLC NAND flash cache.

16. The method of claim 9, further comprising in response to the bit error rate associated with the user data having increased and reached a different predefined threshold, allocating a third section of storage space of the flash device to store the redundancy data, wherein the first section and the second section together define a first page of the flash device and the third section is part of a different page of the flash device.

17. A system comprising:
a processor configured to execute one or more processes; and
a memory configured to store a process executable by the processor, the process when executed operable to:
apportion a flash device having storage space including cells into two sections, a first section of the storage space configured to store user data and a second section of the storage space configured to store redundancy information for the user data, where each cell of the two sections stores a first number of bits; and
determine whether a bit error rate associated with user data stored on the flash device has reached a predefined threshold, and the process further executable to change each cell of the two section to store a second number of bits that is less than the first number of bits, in response to determining that the bit error rate associated with the user data has reached a predefined threshold.

18. The system of claim 17 wherein the redundancy information, is associated with an error correction code algorithm.

19. The system of claim 17 wherein the first number of bits is 2, and wherein the second number of bits is 1.

20. The system of claim 17, wherein the flash device is a multi-level cell (MLC) NAND flash cache.

* * * * *